United States Patent [19]

Henley

[11] 4,096,416
[45] Jun. 20, 1978

[54] VERTICAL DEFLECTION CIRCUIT WITH RETRACE SWITCH PROTECTION

[75] Inventor: Michael Lee Henley, Indianapolis, Ind.

[73] Assignee: RCA Corporation, New York, N.Y.

[21] Appl. No.: 743,312

[22] Filed: Nov. 19, 1976

[51] Int. Cl.² .............................................. H01J 29/70
[52] U.S. Cl. ..................................... 315/401; 315/397
[58] Field of Search ........................ 315/401, 395, 397

[56] References Cited

U.S. PATENT DOCUMENTS

| 3,109,122 | 10/1963 | Cornell et al. | 315/397 |
| 3,402,319 | 9/1968 | McDonald et al. | 315/401 |
| 3,428,854 | 2/1969 | McDonald | 315/401 X |
| 3,816,792 | 6/1974 | Spencer, Jr. | 315/395 X |
| 3,917,977 | 11/1975 | Izumisawa | 315/395 |
| 3,978,372 | 8/1976 | Iwabuchi | 315/397 |
| 3,979,641 | 9/1976 | Arakawa et al. | 315/397 |
| 3,980,925 | 9/1976 | Awata et al. | 315/401 X |
| 4,023,069 | 5/1977 | Peer | 315/397 |

*Primary Examiner*—Malcolm F. Hubler
*Attorney, Agent, or Firm*—Eugene M. Whitacre; Paul J. Rasmussen; Joseph Laks

[57] ABSTRACT

In a vertical deflection circuit, a deflection winding is coupled to an output terminal of a deflection amplifier. The amplifier generates a trace current in the winding in response to drive signals coupled to an input terminal of the amplifier. A first voltage source provides an operating voltage for the amplifier. A bidirectional retrace switch couples the output terminal to a second voltage source for providing a greater magnitude voltage for generating a retrace current in the winding. The bidirectional switch has a controlled semiconductor which is responsive to the drive signals for controlling a main conductive path of the switch during a portion of the retrace interval. A variable resistance device, such as a thermistor, coupled in the main conductive path of the switch, provides a low resistance during the retrace interval but provides a high resistance in the event the drive signals bias the controlled semiconductor element into the state for conduction through the main conductive path during a substantial portion of the trace interval.

7 Claims, 1 Drawing Figure

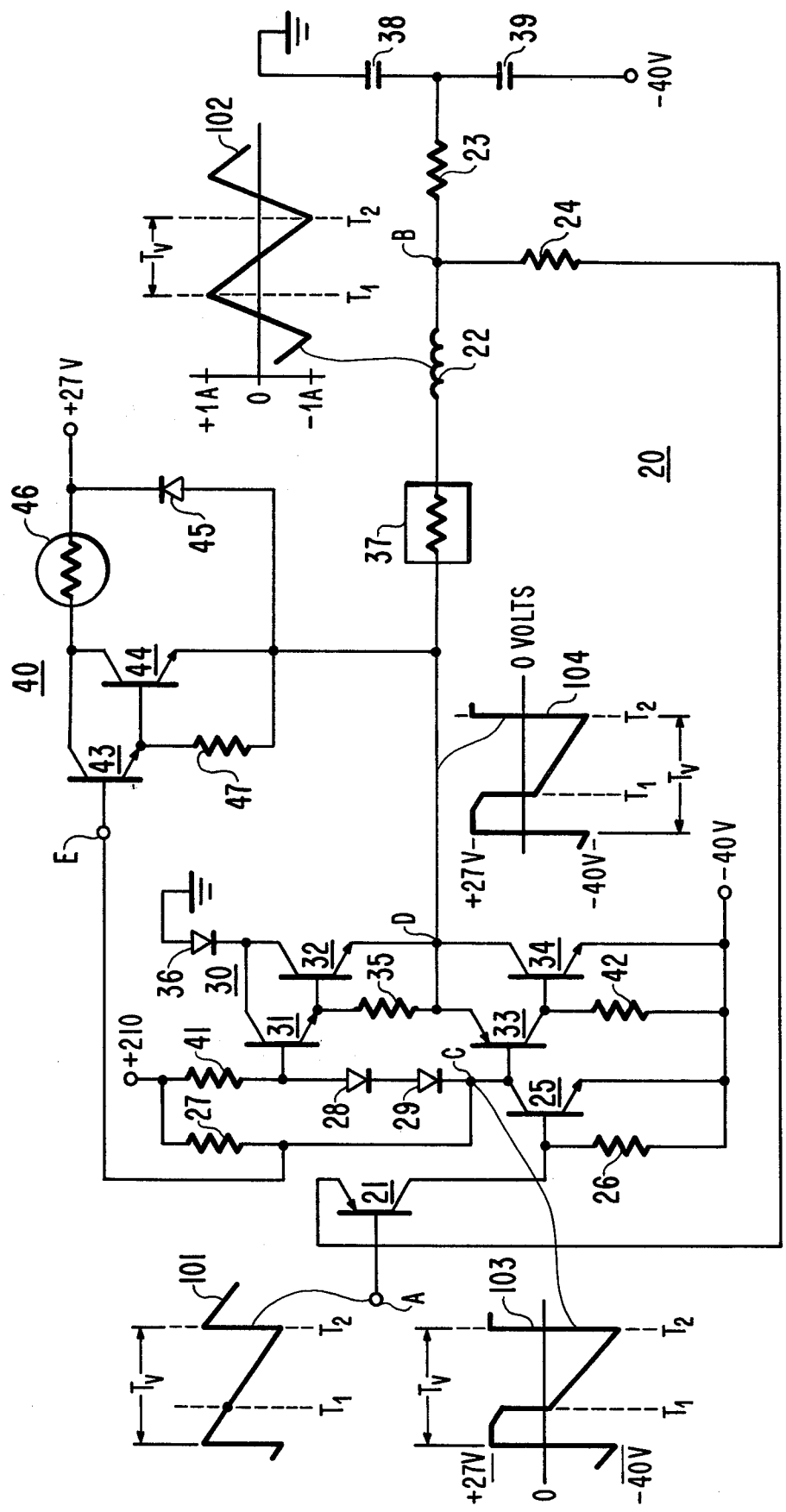

VERTICAL DEFLECTION CIRCUIT WITH RETRACE SWITCH PROTECTION

CROSS-REFERENCE TO RELATED APPLICATIONS

United States Patent Application, Ser. No. 681,036, filed Apr. 28, 1976, now U.S. Pat. No. 4,023,069, entitled, VERTICAL DEFLECTION CIRCUIT, by John Charles Peer.

This invention relates to vertical deflection circuits.

In the aforementioned patent application and in U.S. Pat. No. 3,979,641 granted to Y. Arakawa et al., there are disclosed vertical deflection circuits having a deflection amplifier coupled at an output terminal to a vertical deflection winding for generating a trace current in the winding in response to drive signals at an input terminal of the amplifier. A bidirectional retrace switch coupled between the output terminal and a voltage source conducts during retrace and generates a retrace current in the winding.

In the aforementioned patent application, the retrace switch has a control terminal coupled to the input terminal of the amplifier. It is possible that under certain conditions, the drive signals at the beginning of the trace interval will bias the retrace switch into conducting trace current. If the current through the retrace switch during trace is not limited, the retrace switch may be damaged. The present invention is directed toward protecting the retrace switch under these conditions.

SUMMARY OF THE INVENTION

A vertical deflection circuit has a deflection winding coupled to an output terminal of a deflection amplifier for generating trace current in response to drive signals coupled to an input terminal of the amplifier. A first voltage source provides an operating voltage to the amplifier. A bidirectional switch couples the output terminal to a second voltage source for providing a greater magnitude voltage during a retrace interval, for generating a retrace current in the winding. The bidirectional switch includes a controlled semiconductor having a control terminal coupled to the input terminal. The controlled semiconductor controls the conduction of a main conductive path of the switch during a portion of the retrace interval in response to the drive signals. A variable resistance is coupled to the main conductive path of the switch and provides a low resistance during the retrace interval and provides a high resistance when the drive signals bias the controlled semiconductor into the state for conduction of the main conductive path of the switch during a substantial portion of the trace interval.

BRIEF DESCRIPTION OF THE DRAWING

The FIGURE illustrates a vertical deflection circuit embodying the invention.

DESCRIPTION OF THE INVENTION

Input sawtooth voltage signals 101 repeating at a vertical rate $1/T_V$ are coupled to a terminal A of a vertical deflection circuit 20 of the FIGURE. Terminal A is coupled to the base of an error amplifying transistor 21. The emitter of transistor 21 is coupled to a terminal B which is the junction of a vertical deflection winding 22 and a feedback resistor 23. Deflection current 102, flowing in winding 22, is sampled in resistor 23, and a feedback voltage, representative of the deflection current, is coupled to the emitter of transistor 21 through a resistor 24.

At time $T_1$, the beginning of the trace interval in each deflection cycle, sawtooth voltage 101 has decreased sufficiently, and the feedback voltage has increased sufficiently to forward bias transistor 21. The collector of transistor 21 is coupled to the base of a predriver transistor 25. The base of transistor 25 is coupled to a −40V supply through a resistor 26. The collector of transistor 25 is coupled to an input terminal C of a deflection amplifier 30. Input terminal C is coupled to a +210V supply through a resistor 27.

At time $T_1$, when transistor 21 is forward biased, transistor 25 is also forward biased into conduction. As sawtooth voltage 101 decreases, transistors 21 and 25 conduct more current, and the voltage at input terminal C decreases. The voltage at terminal C serves as a drive voltage signal 103 for driving deflection amplifier 30.

Input terminal C is coupled to the base of a first drive transistor 31 through a pair of serially coupled diodes 28 and 29. The base of transistor 31 is coupled to the +210V supply through a resistor 41. The emitter of transistor 31 is coupled to the base of a first output transistor 32 and is coupled to an output terminal D through a resistor 35. The collector of transistor 31 is coupled to the collector of transistor 32 and to the cathode of a disconnect diode 36. The anode of diode 36 is coupled to ground. The emitter of transistor 32 is coupled to output terminal D.

Output terminal D is coupled to one end of deflection winding 22 through a resistance 37. Resistance 37 represents the total resistance in series with winding 22, such as convergence circuits, pincushion circuits and the winding resistance itself. The other end of winding 22 is coupled to the junction of a pair of coupling capacitors 38 and 39 through feedback resistor 23. The other end of capacitor 38 is coupled to ground, and the other end of capacitor 39 is coupled to the −40V supply.

During the first half of the trace interval, transistors 31 and 32 are conducting. Trace current flows from ground through diode 36, transistor 32, resistor 37, deflection winding 22, resistor 23 and capacitors 38 and 39. The voltage at output terminal D, during the trace interval, is primarily determined by the resistive voltage drops of elements 37, 22 and 23. The inductance of winding 22 provides very little inductive voltage drop across the winding during the trace interval. The voltage at terminal D is such as to forward bias diode 36 during the trace interval. It should be noted that during the trace interval, the voltage at input terminal C is approximately equal to the voltage at output terminal D since the voltage drops across diodes 28 and 29 are approximately equal to the voltage drops across the base-emitters of transistors 31 and 32.

As the drive voltage 103 decreases during the interval $T_1 - T_2$, transistors 31 and 32 also decrease in conduction providing for a linearly decreasing output voltage 104 and a linearly decreasing positive trace current 102.

Input terminal C is coupled to the base of a second drive transistor 33. The emitter of transistor 33 is coupled to output terminal D. The collector of transistor 33 is coupled to the base of a second output transistor 34 and is coupled to the −40V supply through a resistor 42. The collector of transistor 34 is coupled to output terminal D, and the emitter is coupled to the −40V supply. Serially coupled output transistors 32 and 34 and drive transistors 31 and 33 form a quasi-complementary symmetry amplifier for generating trace current in a deflection winding 22.

During the second half of the trace interval, drive voltage 103 has reversed biased transistor 31 and forward biased transistors 33 and 34 into conduction. The linearly decreasing drive voltage 103 provides for a linearly decreasing output voltage 104 and a linearly decreasing negative trace current. Current flows from capacitors 38 and 39 through resistor 23, deflection winding 22, resistance 37 to transistor 34. Diodes 28 and 29 serve the conventional function of preventing distortion of the trace current around the middle of the trace interval as transistor 32 ceases to conduct, and transistor 34 begins to conduct.

Input terminal C is coupled to a control terminal E of a bidirectional retrace switch 40 which conducts deflection current during the retrace interval. Retrace switch 40 includes a control transistor 43, a switch transistor 44 and a diode 45. The base of transistor 43 is coupled to terminal E. The collector of transistor 43 is coupled to the collector of transistor 44 and to one end of a thermistor 46. The other end of thermistor 46 is coupled to a +27V supply. The emitter of transistor 43 is coupled to the emitter of transistor 44 through a resistor 47. The emitter of transistor 44 is coupled to output terminal D as is the anode of diode 45. The cathode of diode 45 is coupled to the +27V supply.

At the end of the trace interval at time $T_2$, the input sawtooth voltage 101 increases to its upper voltage level, turning off transistors 21 and 25. Drive voltage 104 increases to its upper voltage level, which then turns off transistors 31–34. Winding 22 generates a reverse electromagnetic force in an attempt to maintain the current through the winding constant. The voltage at output terminal D increases to 27V + $V_d$, forward biasing diode 45.

Retrace switch 40 now conducts negative retrace current through a main conductive path comprising the diode 45. Winding 22 is now coupled to the +27V supply through switch 40 and is coupled to the −40V supply through capacitor 39. The voltage across winding 22 during retrace is 47 volts which is of greater magnitude than that during trace. The current in winding 22 quickly reverses direction.

When the current reaches zero value, diode 45 ceases to conduct, the output voltage decreases slightly and transistors 43 and 44 are biased into conducting current. Positive retrace current now flows through another main conductive path of switch 40 comprising thermistor 46 and transistor 44, the latter conducting in a saturated state. The voltage at output terminal D is 27V less the small resistive drop of thermistor 46 and also less $V_{ce(sat)}$, the saturated collector-emitter voltage of transistors 43 and 44. The voltage at terminal E is two base-emitter voltage drops greater than the voltage at terminal D.

At $T_1$, input sawtooth voltage 101 has decreased sufficiently, and the current in winding 22 has increased sufficiently to forward bias transistors 21 and 25 into conduction. This point in time defines the end of the switched retrace interval. The drive voltage 103 at input terminal C decreases, turning off transistors 43 and 44. The voltage at output terminal D decreases until transistors 31 and 32 and diode 36 are forward biased into conduction. Transistor 32 begins to conduct the trace current, and a new deflection cycle has begun.

Drive voltage signals 103 turn off transistors 31–34 at the end of the trace interval, thereby biasing retrace switch 40 into conducting retrace current. At the end of the retrace interval, drive voltage signals 103 turn off retrace switch 40 by turning off transistors 43 and 44 and biasing transistors 31 and 32 into conducting trace current.

Under normal operation, thermistor 46 conducts little current when averaged over each deflection cycle, since it conducts retrace current only during the second part of retrace when transistor 44 is conducting. When the average current that flows through thermistor 46 is small, little heating of the thermistor occurs, and the resistance of the thermistor is relatively small and may be neglected.

In certain situations, drive voltage 103 may be sufficiently positive so as to bias transistors 43 and 44 of switch 40 conducting trace current for a significant portion of the trace interval. If the trace current through transistor 44 is not limited, operation of transistor 44 in the active region for any significant interval will eventually destroy the transistor.

Thermistor 46 functions to protect retrace switch 40 from damage under these conditions. Since thermistor 46 now also conducts trace current, the average current flowing through the thermistor is relatively large. Significant heating of the thermistor occurs, and its resistance becomes relatively large, limiting the current flowing through transistor 44 and preventing any damage to the transistor.

When the conditions return to normal, little average current flows through thermistor 46 and its resistance returns to its former relatively small value.

Drive voltage 103 will bias transistors 43 and 44 into conducting trace current in situations of low oscillator frequency of the sawtooth voltage generator or of a high setting to the sawtooth voltage amplitude controls. In either situations, the peak value of the sawtooth voltage increases, providing for larger peak deflection current through winding 22. Since, as previously mentioned, the voltage at teminal D at the beginning of trace is determined by the resistive voltage drop across elements 37, 22 and 23, a larger peak deflection current at the beginning of trace will result in a more positive voltage at output terminal D. With too large a positive voltage, disconnect diode 36 cannot become forward biased and transistor 32 cannot conduct trace current. To maintain trace current through winding 22, the drive voltage 103 at input terminal C will change from its retrace interval value of around 27 volts and equal the voltage at output terminal D plus two base-emitter voltage drops. When this change occurs, transistors 43 and 44 are biased into conduction and conduct trace current in place of transistors 31 and 32. They conduct until the time disconnect diode 36 again is forward biased.

In a situation such as just described, thermistor 46 acts as a variable resistance device for protecting switch transistor 44. The thermistor provides a relatively large resistance in those situations wherein the drive voltage signals bias transistors 43 and 44 into conduction during substantial portions of the trace interval, while providing a relatively small resistance during the retrace interval in normal situations. This protection circuit allows the use of a more economical lower current rating transistor.

What is claimed is:
1. A vertical deflection circuit comprising:
a deflection winding;

a deflection amplifier with an input terminal and having an output terminal coupled to said deflection winding for generating a trace current in said deflection winding during a trace interval in each deflection cycle in response to drive signals coupled to said input terminal;

a first voltage source coupled to said amplifier for providing an operating voltage to said amplifier;

a second voltage source;

bidirectional switching means coupled between said output terminal and said second voltage source for providing a voltage of greater magnitude than said first voltage source for generating a retrace current in said deflection winding during a retrace interval in each deflection cycle, said bidirectional switching means including a controlled semiconductor comprising a control terminal coupled to a first terminal at which there is developed a deflection rate signal and a main conductive path coupled to said second voltage souce and one of said output terminal and said deflection winding, said control terminal responsive to said drive signals for biasing said main conductive path from one conduction state to another for providing said voltage of greater magnitude during at least a portion of said retrace interval; and variable resistance means coupled in series with said main conductive path, said variable resistance means providing a relatively large resistance to the current in said main conductive path when said drive signals bias said main conductive path into conduction during a substantial portion of said trace interval for limiting the current in said main conductive path, and said variable resistance means otherwise providing a relatively small resistance during said retrace interval.

2. A vertical deflection circuit according to claim 1, wherein said variable resistance means comprises a thermistor.

3. A vertical deflection circuit according to claim 1, wherein said controlled semiconductor comprises a transistor with a base and emitter of said transistor coupled between said first and output terminals.

4. A vertical deflection circuit according to claim 3, wherein said bidirectional switching means includes a diode coupled to one of said output terminal and said deflection winding and to said second voltage source for conducting said retrace current during at least a portion of said retrace interval.

5. A vertical deflection circuit according to claim 1, wherein said deflection amplifier comprises two serially coupled transistors, said drive signals alternately biasing each of said serially coupled transistors into conduction during said trace interval and turning off both of said serially coupled transistors at the end of said trace interval.

6. A vertical deflection circuit according to claim 5, wherein a disconnect diode is serially coupled with the collector-emitter path of one of said serially coupled transistors, said disconnect diode poled for nonconduction during at least a portion of said retrace interval.

7. A vertical deflection circuit according to claim 6, wherein said deflection amplifier includes two drive transistors coupled to said serially coupled transistors for forming a quasi-complementary symmetry amplifier with the bases of said drive transistors coupled to said first terminal.

* * * * *